United States Patent
Choi et al.

[11] Patent Number: 6,075,725
[45] Date of Patent: Jun. 13, 2000

[54] MULTILEVEL MEMORY DEVICES HAVING MEMORY CELL REFERENCED WORD LINE VOLTAGE GENERATORS WITH PREDETERMINED OFFSETS

[75] Inventors: Byeng-Sun Choi; Young-Ho Lim, both of Kyunggi-do, Rep. of Korea

[73] Assignee: Samsung Electronics Co., Ltd., Rep. of Korea

[21] Appl. No.: 09/219,673

[22] Filed: Dec. 23, 1998

[30] Foreign Application Priority Data

Dec. 29, 1997 [KR] Rep. of Korea .................. 97-77271

[51] Int. Cl.[7] .................................................. G11C 16/06
[52] U.S. Cl. .............................. 365/185.2; 365/185.03; 365/185.21; 365/185.24
[58] Field of Search ........................... 365/185.2, 185.03, 365/185.21, 185.24, 210

[56] References Cited

U.S. PATENT DOCUMENTS

| | | | |
|---|---|---|---|
| 5,457,650 | 10/1995 | Sugiura et al. ........................ | 365/184 |
| 5,463,587 | 10/1995 | Maruyama .............................. | 365/210 |
| 5,642,312 | 6/1997 | Harari ................................. | 365/185.23 |
| 5,748,534 | 5/1998 | Dunlap et al. ...................... | 365/185.21 |
| 5,761,132 | 6/1998 | Kim ................................... | 365/189.05 |
| 5,768,188 | 6/1998 | Park et al. ......................... | 365/185.03 |
| 5,768,191 | 6/1998 | Choi et al. ......................... | 365/185.22 |
| 5,815,436 | 9/1998 | Tanaka et al. ...................... | 365/185.03 |
| 5,883,837 | 3/1999 | Calligaro et al. .................. | 365/189.01 |

*Primary Examiner*—Vu A. Le
*Assistant Examiner*—Tuan T. Nguyen
*Attorney, Agent, or Firm*—Myers Bigel Sibley & Sajovec

[57] ABSTRACT

A word line voltage generating apparatus is provided for a multi-level memory device including a plurality of memory cells, each of which has a programmable threshold voltage such that the memory cell produces a current in response to a word line voltage applied thereto. The apparatus includes a plurality of memory cell referenced regulators connected to an output terminal that is configured to connect to the plurality of memory cells, a respective one of the memory cell referenced regulators including a variable current mirror having a controlled current path and an output current path including the output terminal, the controlled current path having a controlled impedance therein that provides a variable impedance responsive to a control voltage applied thereto such that current produced at the output terminal is proportional to current in the controlled current path, and a control circuit connected between the output terminal and the controlled impedance and including a dummy memory cell having a predetermined threshold voltage, the control circuit operative to apply a control voltage to the controlled impedance to vary a current at the output terminal when an output voltage at the output terminal is greater than a sum of the predetermined threshold voltage of the dummy memory cell and a predetermined offset voltage. According to an embodiment of the present invention, the control circuit comprises a dummy memory cell transistor connected in series with a resistor.

12 Claims, 10 Drawing Sheets

MULTILEVEL MEMORY DEVICES HAVING MEMORY CELL REFERENCED WORD LINE VOLTAGE GENERATORS WITH PREDETERMINED OFFSETS

RELATED APPLICATION

The present application is related to U.S. patent application Ser. No. 09/198,705, Choi et al., filed Nov. 24, 1998, assigned to the assignee of the present invention and incorporated herein by reference in its entirety.

FIELD OF THE INVENTION

The present invention relates to memory devices, and more particularly, to multi-level memory devices.

BACKGROUND OF THE INVENTION

A memory cell array of, for example, a read-only memory (ROM), typically includes a plurality of memory cells arranged in rows and columns. Word lines typically extend along and are connected to the rows of the memory cells, while bit lines extend along and are connected to the columns of the memory cells. Typically, each memory cell comprises a transistor, e.g., a floating gate transistor, having a gate electrode connected to a word line, a source electrode connected to a signal ground, and a drain electrode connected to a bit line. To read data from a selected memory cell, the bit line to which the selected memory cell is connected to a sense amplifier and a word line to which the selected memory cell is connected is driven by a word line voltage.

Traditional single-bit ROM memory cells include a transistor having a threshold voltage that is set at one of two levels so that the memory cell stores one bit of data. To store more data, "multi-level" (or "multi-bit") devices have been proposed that utilize more than two threshold voltage levels to allow a signal memory cell to store multiple bits of data.

Various types of multi-level memories are possible. In one type, the gate length or gate width of the transistor of each memory cell is varied so that the current flowing when the memory cell is accessed may be set at various values. In other types of multilevel memories, the quantity of impurity ions injected into the metal oxide semiconductor (MOS) transistor of each memory cell is varied so that the threshold voltage of the MOS transistor may be set at various values.

FIG. 1 illustrates relationships between predetermined word line voltage thresholds WL0–WL2 and threshold voltage distributions Vth1–Vth4 for a multi-bit ROM. Each memory cell of multi-bit ROM may be classified as having one of four logic states 00–11, based on the relationship of its threshold voltage to the word line voltage level thresholds WL0–WL1.

FIG. 2 is a diagram showing reference voltages applied to a word line in a memory device such as the memory device 1 illustrated in FIG. 3 during a data reading operation for a multi-bit memory cell. While the word line is driven at a first word line voltage WL0, a sense amplifier circuit 17 detects whether a current (cell current) flows through the selected memory cell. Next, a second word line voltage WL1 higher than the first word line voltage WL0 is applied to the word line while the sense amplifier 17 determines whether a cell current flows through the selected memory cell. A third word line voltage WL2 higher than the first and second word line voltages WL0, WL1 is then applied to the word line while the sense amplifier determines whether a cell current flows through the memory device. As is known to those skilled in the art, the word line voltage at which the memory cell begins to exhibit current flow indicates the logic state of the memory cell. Generally, it is very important that the word line voltages WL0–WL2 are precisely controlled to prevent data sensing errors.

A typical multi-level memory device 1, illustrated in FIG. 3, includes an array 10 of multi-bit memory cells connected to word lines and bit lines (not shown). The word lines are selected by a pre row decoder circuit 11 and a block decoder circuit 12 in response to an address Ai applied thereto. A word line voltage generating circuit 13 generates a word line voltage VP and applies it to a selected word line via the pre-row decoding circuit 11 and the block decoder circuit 12. The voltage VP has different voltage levels, for example, the word line voltages WL0, WL1, WL2 illustrated in FIG. 2. The word line voltage generating circuit 13 receives a power supply voltage VCC/VPP from a voltage source 14, and generates the word line voltage VP therefrom. A bit line of the array 10 is selected by a column decoder circuit 15 and a column pass gating circuit 16, and a sense amplifier circuit 17 connected to the selected bit line detects whether a cell current flows in a memory cell connected to the selected bit line.

A conventional word line voltage generating circuit 13 is illustrated in FIG. 4. The structure of and exemplary operations for the word line voltage generating circuit 13 will be described below with reference to FIGS. 4 and 5. As shown in FIG. 5, when a signal STB is at a high level and signals NO_ACT1, NO_ACT2 and NO_ACT3 are low, an output node ND1 is grounded through an NMOS transistor 48. First, second and third word line voltage generators 50, 51 and 52 are disabled because NMOS transistors 46 and 47 in the generators 50, 51 and 52 are turned off and PMOS transistors 41 in the generators 50, 51 and 52 are turned on.

A data reading operation begins when the signal NO_ACT1 goes to a high level from a low level, while the signals NO_ACT2 and NO_ACT3 continue to remain at a low level. This causes the PMOS transistor 41 in the first word line voltage generator 50 to turn off and the NMOS transistors 46 and 47 to turn on. As a result, the node ND1 is pulled up through action of a PMOS transistor 43 of the first word line voltage generator 50.

As voltage at the output node ND1 increases, the gate voltage of a PMOS transistor 45 also increases. When the gate voltage of the PMOS transistor 45 exceeds a reference voltage VREF, the PMOS transistor 43 is turned off. Thus, the node ND1 voltage VP is regulated to a voltage:

$$VP = VREF \times R \frac{0}{(R0 + R1)}.$$

The second word line voltage generator 51 and the third word line voltage generator 52 operate in a similar manner in response to the signals NO_ACT2 and NO_ACT3, respectively. The second word line voltage generator 51 regulates the voltage VP to:

$$VP = VREF \times R \frac{0}{(R0 + R2)},$$

and the third word line voltage generator 52 regulates the output voltage VP to:

$$VP = VREF \times R \frac{0}{(R0 + R3)},$$

where the resistors R1, R2 and R3 have the relationship of R1<R2<R3.

Another conventional word line voltage generating circuit 13 is depicted in FIG. 6. The structure of and exemplary operations for the word line voltage generating circuit 13 of FIG. 6 will be described below with reference to FIGS. 6 and 7.

When a signal STB is at a high level, and a signal NO__ACT is at a low level, an output node ND2 is grounded through an NMOS transistor 58 and the word line voltage generating circuit 13 is disabled, as a PMOS transistor 51 is turned on and NMOS transistors 56 and 57 are turned off.

When the signal STB and the signal NO__ACT go to a high level, the node ND2 is pulled up through a PMOS transistor 53 because a gate voltage VREF__V1 of an NMOS transistor 54 is higher than the gate voltage of an NMOS transistor 55. When the gate voltage of the NMOS transistor 55 exceeds the voltage VREF__V1, the PMOS transistor 53 is turned off. Thus, the node ND2 is regulated to a voltage:

$$VP = VREF\_V1 \times R \frac{0}{(R0 + R4)}.$$

As shown in FIG. 7, the voltage VREF__V is varied, changing from a voltage VREF__V1 to a voltage VREF__V2 to a voltage VREF__V3. At these set points, the node ND2 voltage may be expressed as:

$$VP = VREF\_V2 \times R \frac{0}{(R0 + R4)}, \text{ and}$$

$$VP = VREF\_V3 \times R \frac{0}{(R0 + R4)}.$$

Yet another conventional word line voltage generating circuit 13 is depicted in FIG. 8. The structure of and exemplary operations for the word line voltage generating circuit 13 if FIG. 8 will be described below with reference to FIGS. 8 and 9.

When signals STB, STG2 and STG3 are at a high level and a signal NO__ACT is at a low level, an output node ND3 is grounded through an NMOS transistor 68, a PMOS transistor 61 is turned on and NMOS transistors 66 and 67 are turned off, disabling the word line voltage generating circuit 13. When the signal STB next goes to a low level and the signal NO__ACT goes to a high level, a data reading operation is started. The signals STG2 and STB3 continue at a high level turning on PMOS transistor 63, causing the voltage at the output node ND3 to increase. When the gate voltage of an NMOS transistor 65 exceeds the gate voltage of an NMOS transistor 64, that is, a reference voltage VREF, the PMOS transistor 63 turns off. As a result, the node ND3 voltage VP is regulated to a voltage:

$$VP = VREF \times \frac{R0}{(R0 + R7)}.$$

Similarly, when the signal STG2 becomes low while the signal STG3 remains high, the gate voltage of the NMOS transistor 65 falls below the reference voltage VREF. This turns the PMOS transistor 63 on so that the voltage VP at node ND3 increases. The voltage at node ND3 thus is stabilized at a new set point:

$$VP = VREF \times \frac{R0}{(R0 + R5 + R7)}.$$

Similarly, when the signals STB, STG2 and STG3 are all low:

$$VP = VREF \times \frac{R0}{(R0 + R5 + R6 + R7)}.$$

Because memory cell threshold voltages may vary due to process variations, word line voltage may need to be varied to correspond to such a threshold voltage variation to ensure that data reading operations can be performed reliably. To address such variations, the reference voltage level or resistance of resistors in the conventional word line voltage generating circuits 13 illustrated in FIGS. 4, 6 and 6 typically must be readjusted at a wafer level stage. This can increase cost and introduce manufacturing delays.

SUMMARY OF THE INVENTION

In light of the foregoing, it is an object of the present invention to provide word line voltage generating circuits that can compensate for memory cell threshold voltage variations.

This and other objects are provided, according to the present invention by word line voltage generator circuits in which a current mirror circuit is controlled by a control circuit that includes a dummy memory cell such that the current mirror circuit produces an output voltage that is regulated to a sum of the threshold voltage of the dummy memory cell and a predetermined offset voltage. The control circuit may include a resistor connected in series with the current path of the dummy memory cell.

In particular, according to the present invention, a word line voltage generating apparatus is provided for a multi-level memory device including a plurality of memory cells, each of which has a programmable threshold voltage such that the memory cell produces a current in response to a word line voltage applied thereto. The apparatus includes a plurality of memory cell referenced regulators connected to an output terminal that is configured to connect to the plurality of memory cells, a respective one of the memory cell referenced regulators including a variable current mirror having a controlled current path and an output current path including the output terminal, the controlled current path having a controlled impedance therein that provides a variable impedance responsive to a control voltage applied thereto such that current produced at the output terminal is proportional to current in the controlled current path, Nada control circuit connected between the output terminal and the controlled impedance and including a dummy memory cell having a predetermined threshold voltage, the control circuit operative to apply a control voltage to the controlled impedance to vary a current at the output terminal when an output voltage at the output terminal is greater than a sum of the predetermined threshold voltage of the dummy memory cell and a predetermined offset voltage.

According to an embodiment of the present invention, the control circuit comprises a dummy memory cell transistor having a control electrode electrically coupled to the output terminal and a controlled electrode connected to the controlled impedance, wherein the dummy memory cell is operative to vary a control voltage applied to the controlled impedance when a voltage at the control electrode is greater than the sum of the predetermined threshold voltage and the predetermined offset voltage. The control circuit may further comprise a resistor connected in series between the dummy memory cell and a signal ground. Improved world line voltage generating apparatus are thereby provided.

DETAILED DESCRIPTION OF THE PREFERRED EMBODIMENT

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 3:
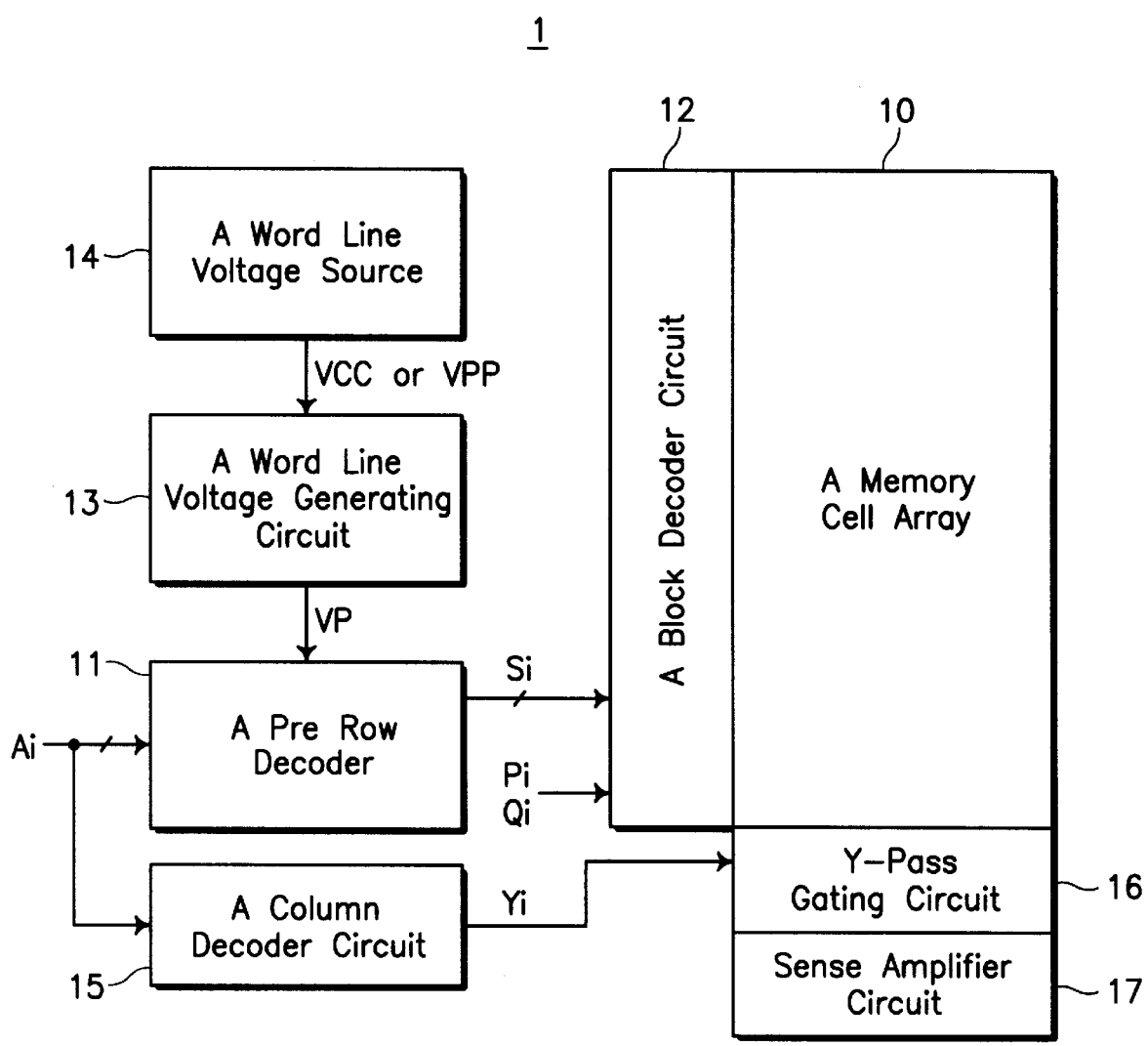
Figure 4:
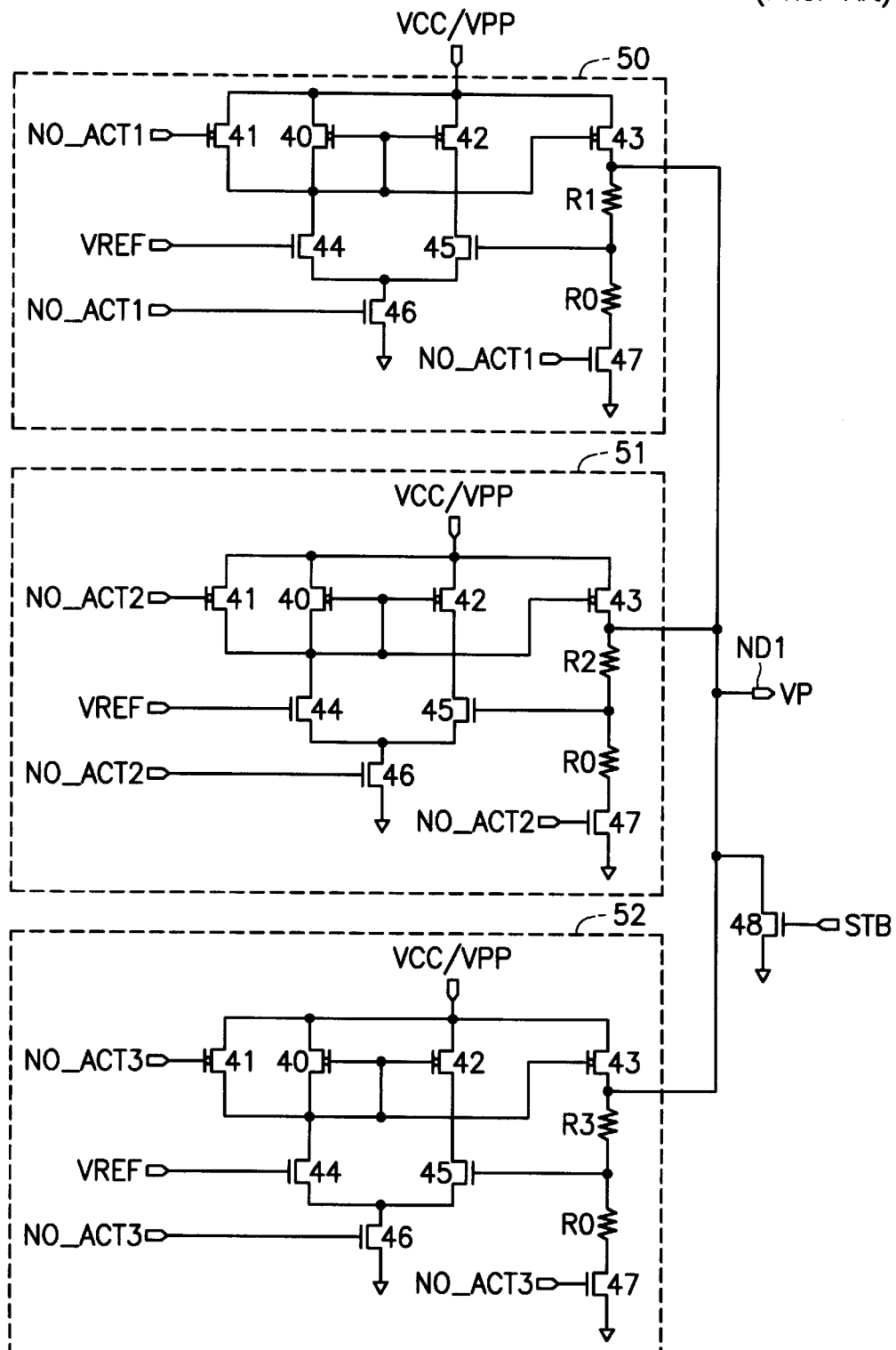
Figure 5:
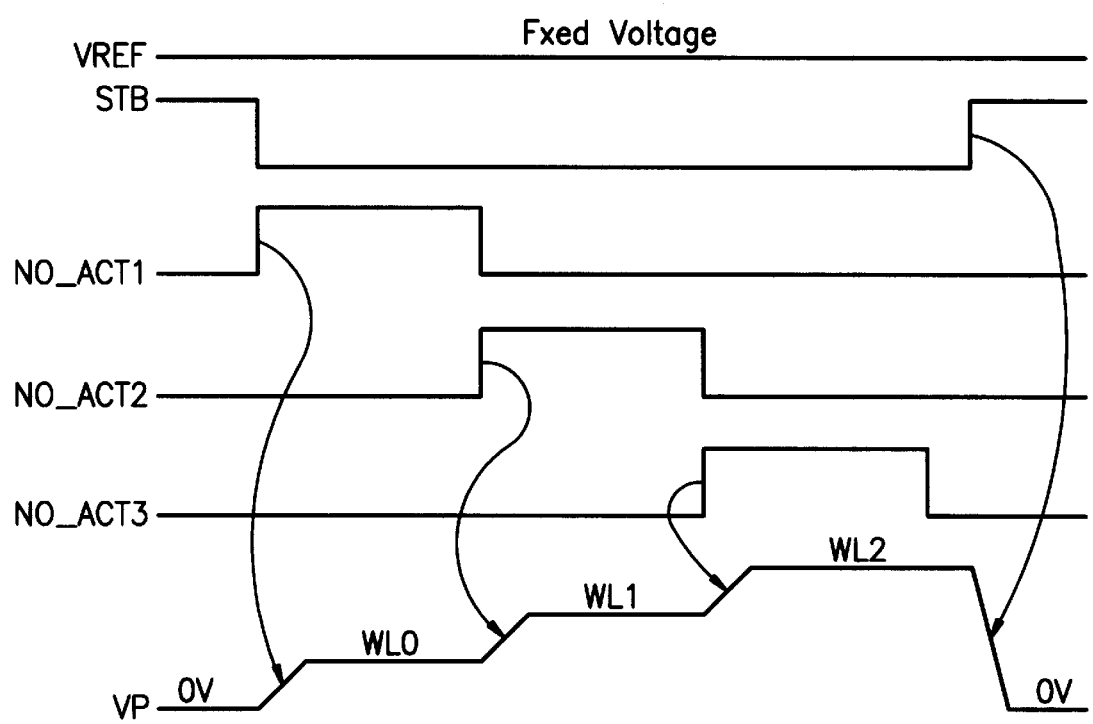
Figure 6:
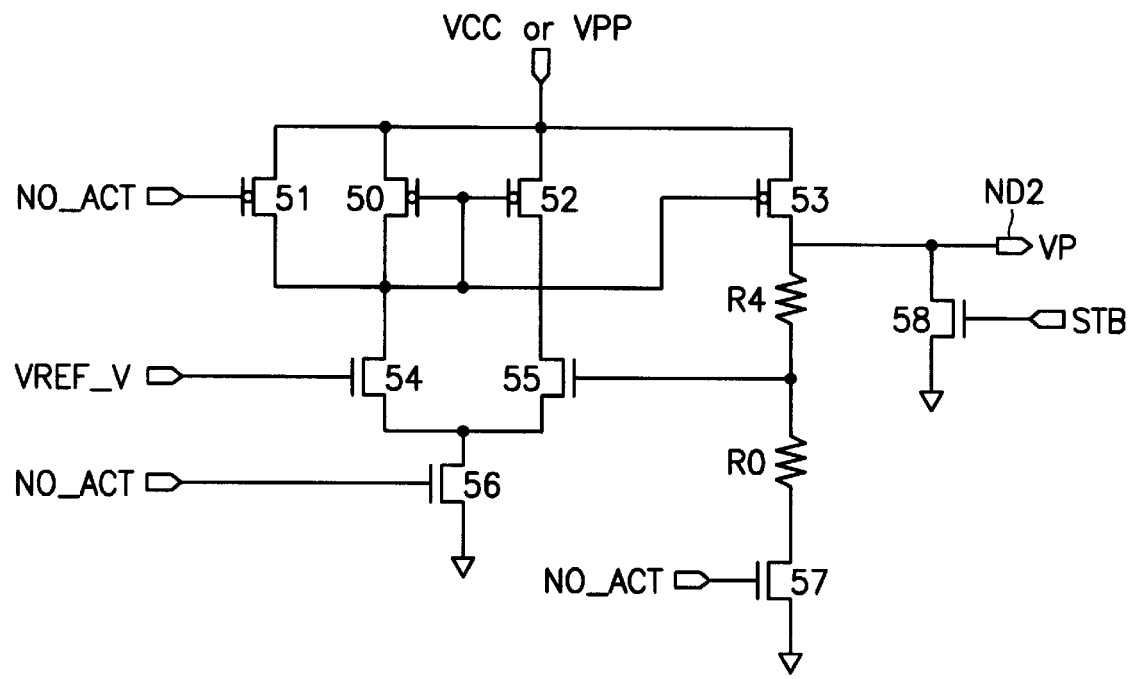
Figure 7:
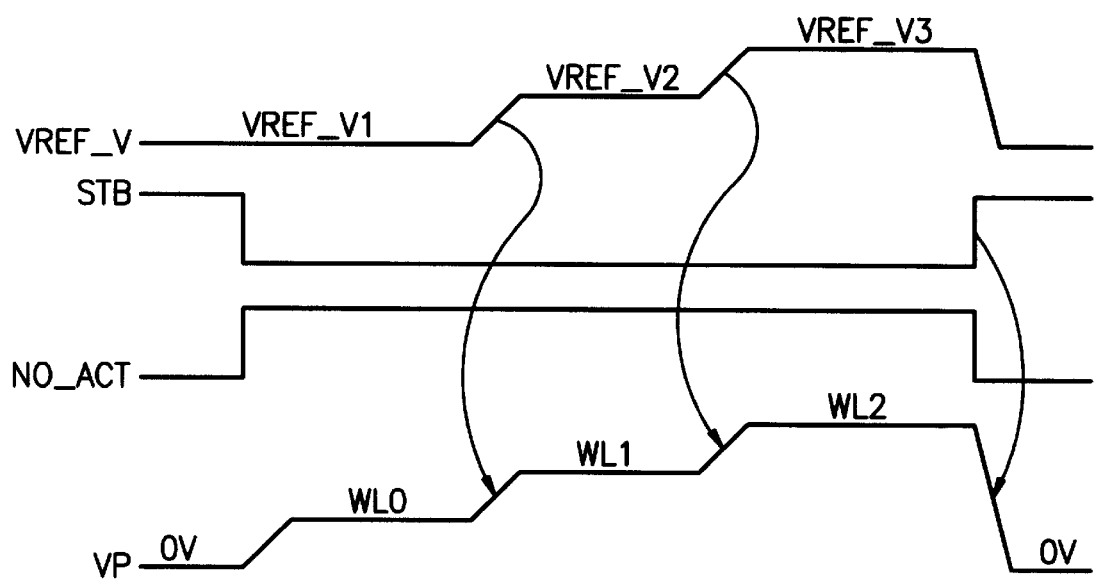
Figure 8:
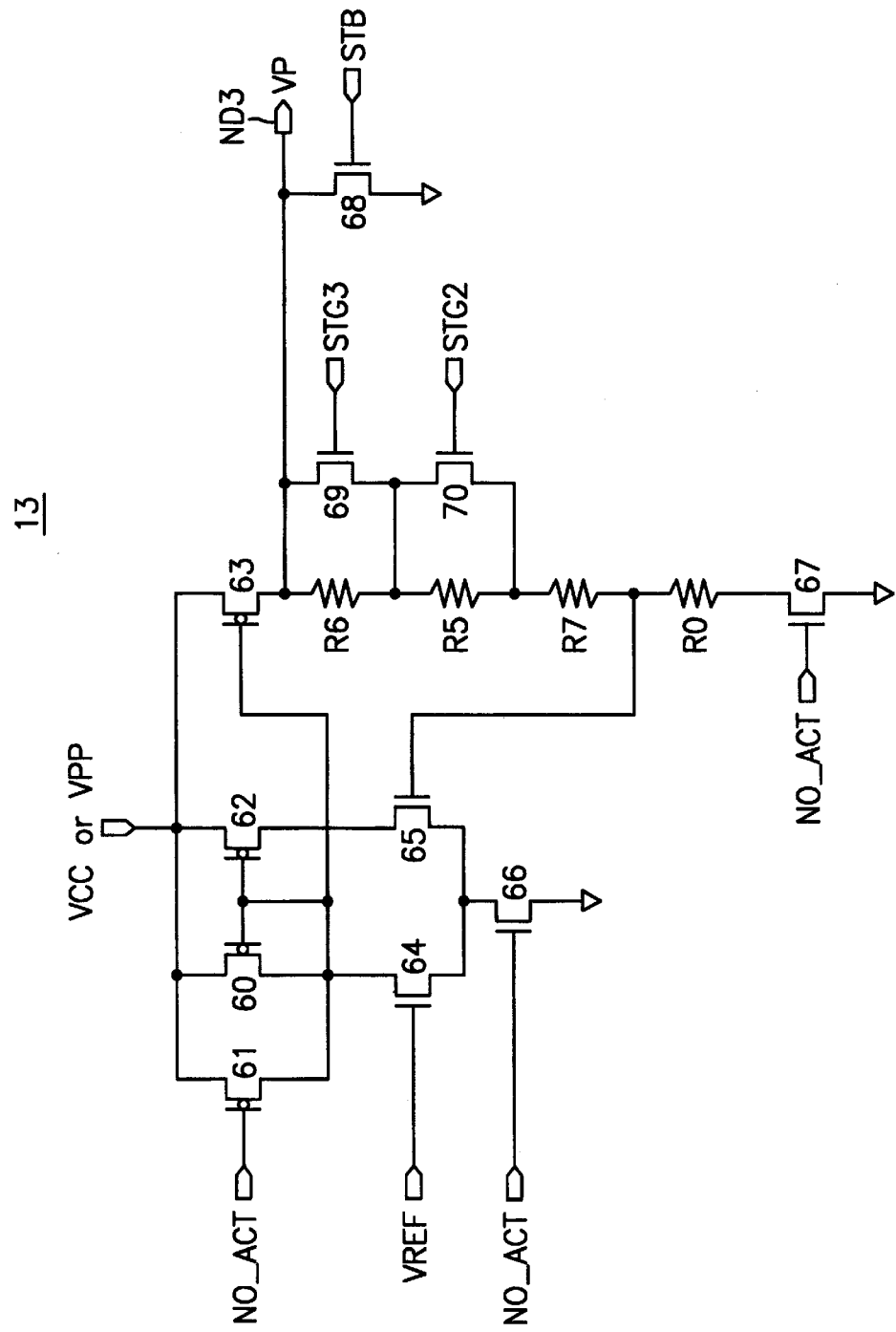
Figure 9:
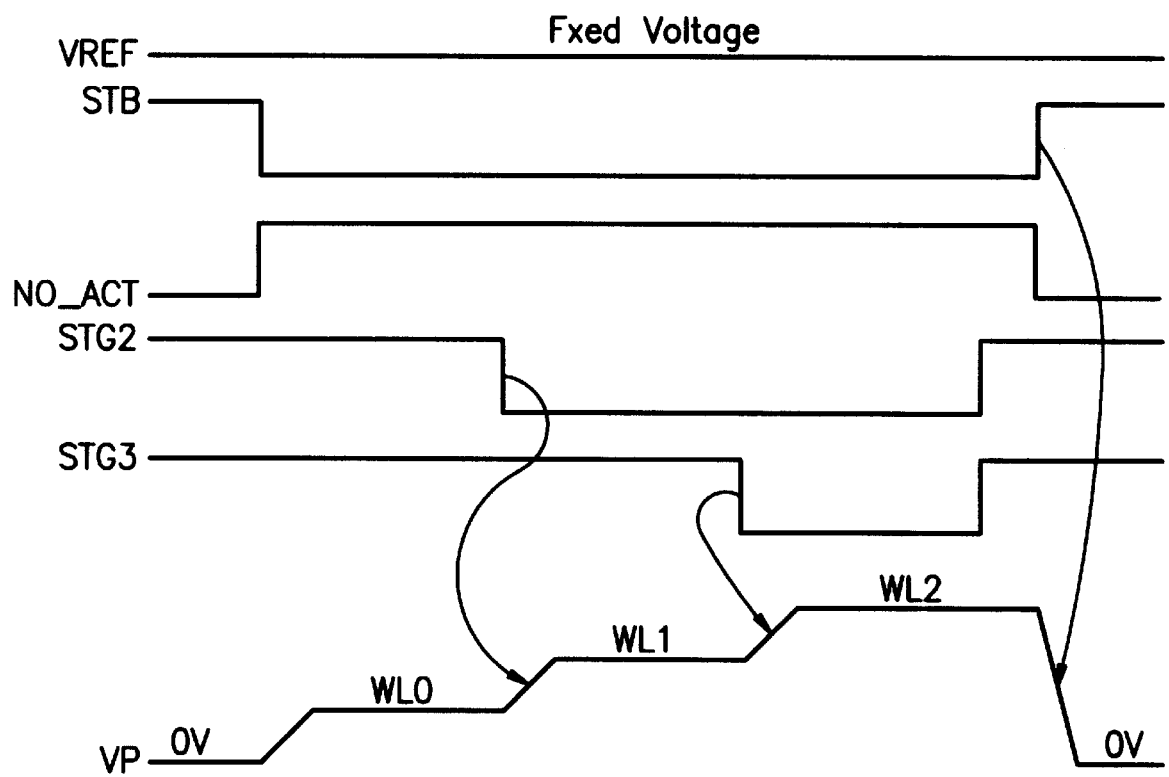
Figure 10:
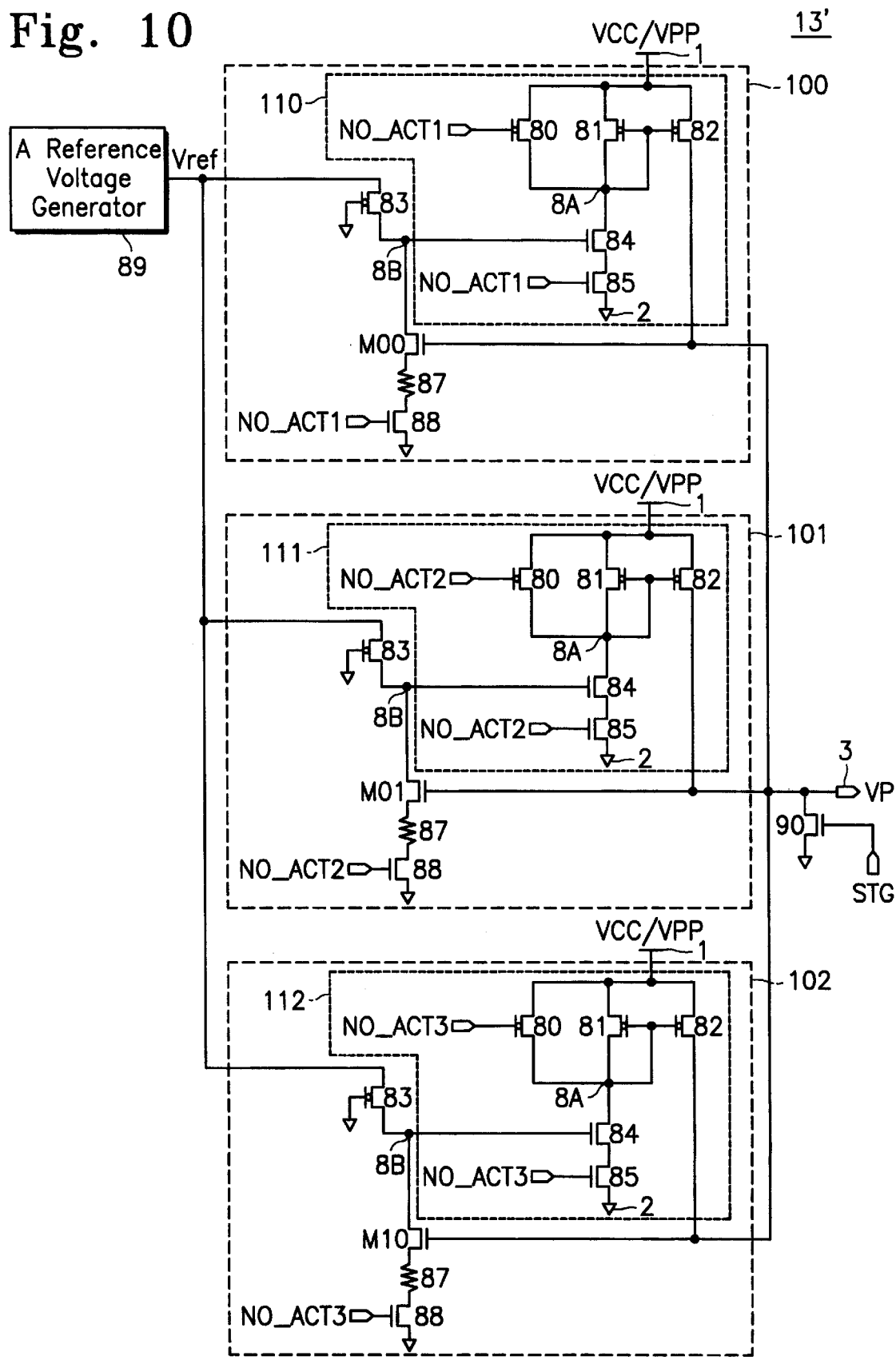
FIG. 10 is a schematic diagram illustrating a word line voltage generating circuit according to an embodiment of the present invention.

FIG. 10 is a circuit diagram showing a word line voltage generating circuit 13' which may be used, for example, in a multilevel memory device 1 as illustrated in FIG. 3, according to an embodiment of the present invention. The word line voltage generating circuit 13' uses three dummy cells M00, M01 and M10 having threshold voltages Vth1, Vth2 and Vth3 to generate a word line voltage VP.

The word line voltage generating circuit 13' comprises a reference voltage generator 89 and first, second and third word line voltage generators 100, 101 and 102. The reference voltage generator 89 generates a reference voltage Vref of a constant level, for example, about 2 V, regardless of a power supply voltage variation, and supplies the first, second and third word line voltage generators 100, 101 and 102 with the reference voltage Vref. The first, second, and third word line voltage generators 100, 101 and 102 are connected to an output node 3 at which an output voltage VP produced, that is, a word line voltage for application to the pre row decoder circuit 11 of FIG. 3. Each of the generators 100, 101 and 102 receives a power supply voltage VCC/VPP. The output node 3 is discharged through an NMOS transistor 90 switched on and off according to a signal STG. The first word line voltage generator 100 generates a VP voltage of WL0 when a first sensing operation is performed (when control signal NO_ACT1 is enabled), the second word line voltage generator 101 generates a VP voltage of a WL1 level therein when a second sensing operation is performed (when a signal NO_ACT2 is enabled), and the third word line voltage generator 102 does a VP voltage of a WL2 level therein when a third sensing operation is performed (when a signal NO_ACT3 is enabled).

The first word line voltage generator 100 includes a variable current mirror 110, a dummy cell M00, a PMOS transistor 83, an NMOS transistor 88 and a resistor 87. The variable current mirror 110 includes three PMOS transistors 80, 81 and 82 and two NMOS transistors 84 and 85 with two PMOS transistors 80 and 81 connected in current mirror configuration. The PMOS transistor 80 has a gate that receives the control signal NO_ACT1, has one current electrode receiving the supply voltage VCC/VPP, and another current electrode connected to a node 8A. The PMOS transistor 81 has a current path between the supply voltage VCC/VPP and the node 8A, and a gate connected to the node 8A. The PMOS transistor 82 has a gate coupled to the node 8A and has a current path formed between the supply voltage VCC/VPP and the node 3. The NMOS transistors 84 and 85 have current paths connected between the node 8A and a ground voltage, and have their gates connected to the node 8B and the control signal NO_ACT1, respectively. The dummy cell M00 is set to have a threshold voltage Vth1, and has its gate connected to the node 3. One current electrode of the cell M00 is tied to one end of the resistor 87 and the other current electrode of the cell M00 is connected to the reference voltage generator 89 through the PMOS transistor 83 (whose gate is grounded). The other end of the resistor 87 is grounded through the NMOS transistor 88, which is switched on/off responsive to the control signal NO_ACT1. In this embodiment, a current driving capacity of the PMOS transistor 83 is less than that of the dummy cell M00, allowing the PMOS transistor 83 to serve as a transistor for precharging the node 8B.

In the second and third word line voltage generators 101 and 102, elements that are identical to those of the first word line voltage generator 100 are labeled with the same reference numerals. The second word line voltage generator 101 differs from the first word line voltage generator 100 in that the dummy cell M01 has a threshold voltage Vth2 higher than that of the dummy cell M00. Therefore, when a control signal NO_ACT2 is activated during a second sensing period, the voltage VP is higher than during the first sensing period. The third word line voltage generator 102 differs from the first and second word line voltage generators 100 and 101 in that the dummy cell M10 has a threshold voltage Vth3 higher than those of the dummy cells M00 and M01. Therefore, when a control signal NO_ACT3 is activated during a third sensing period, the voltage VP is higher than during the second sensing period.

Figure 11:
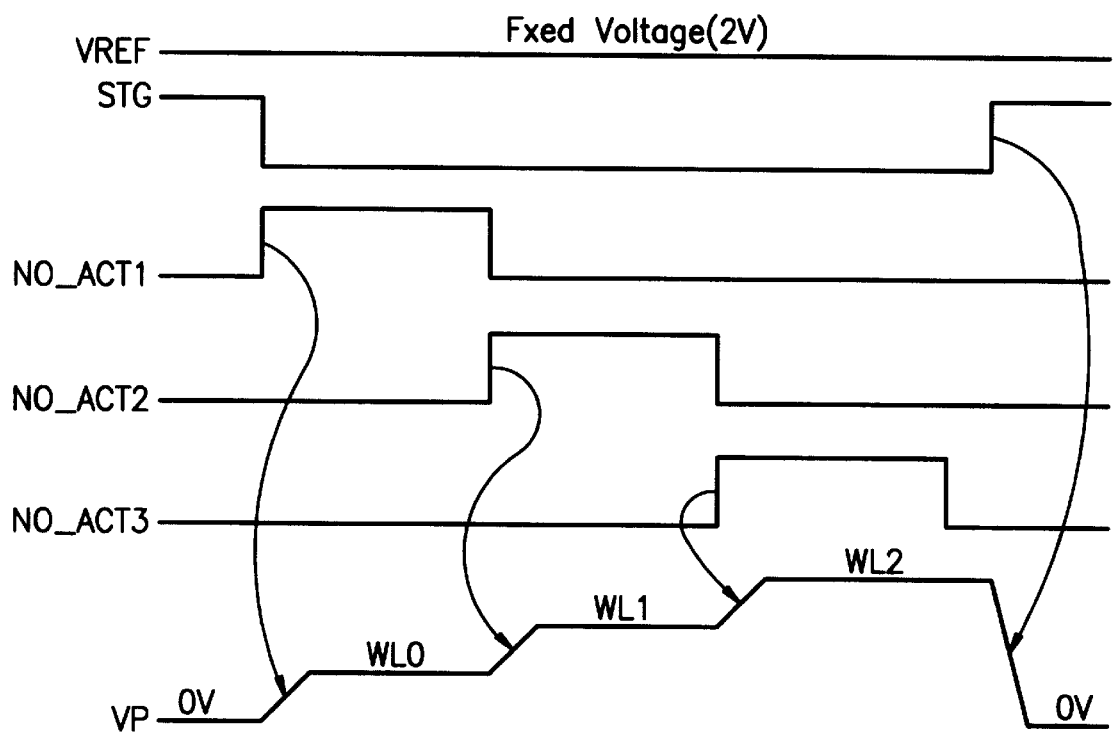
FIG. 11 is a timing diagram illustrating exemplary operations of a word line voltage generating circuit according to an embodiment of the present invention.

FIG. 11 is a timing diagram illustrating exemplary operations of the word line voltage generating circuit 13'. When the control signal STG is high and the control signals NO_ACT1, NO_ACT2 and NO_ACT3 are low, the output voltage VP is low, approximately 0 V. This causes the transistors 80 and 90 to conduct while the transistors 85 and 88 are non-conductive. Thus, the node 8A is charged up to about the power supply voltage VCC/VPP through the turned-on PMOS transistor 80. As a result, the current path through the PMOS transistor 82 is blocked. The gates of the dummy cells M00, M01 and M10 are reset low by the NMOS transistor 90 switched on by the signal STG. In the circuit 13' of the illustrated embodiment, negligible current is consumed by the word line voltage generators 100 101 and 102 when no data reading operation is performed, because the transistors 85 and 88 are turned off.

A data reading operation is started when the control signal STG goes low and the control signal NO_ACT1 goes high as the control signals NO_ACT2 and NO_ACT3 remain low. This activates the first word line voltage generator 100, while leaving the second and third word line voltage generators 101 and 102 inactive. The PMOS transistor 80 of the first word line voltage generator 100 is turned off and the NMOS transistors 85 and 88 thereof are turned on responsive to the signal NO_ACT1, so that the node 8A is discharged through the NMOS transistors 84 and 85.

As the gate of the PMOS transistor 82 is taken low, the voltage VP at the output node 3 increases, approaching the threshold voltage Vth1 of the dummy cell M00. As the output voltage VP is raised, the gate of the dummy cell M00 is also pulled up towards the threshold voltage Vth1. The gate-source voltage of the dummy cell M00 is less than the threshold voltage Vth1, however, because of the resistor 87, i.e., the source voltage of the dummy cell M00 is increased by the voltage across the resistor 87. Therefore, although the gate voltage of the dummy cell M00 approaches the threshold voltage Vth1, the dummy cell M00 remains non-conductive because Vgs<Vth1.

Figure 1:
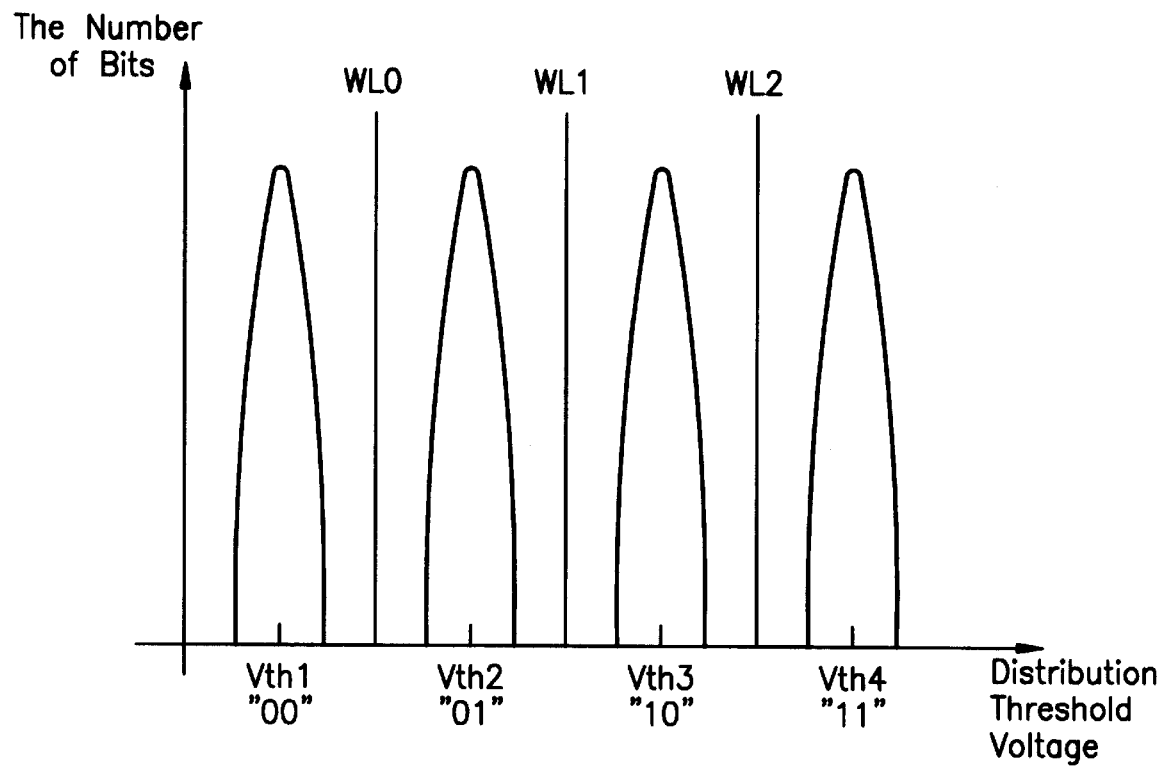
FIGS. 1–9 illustrate conventional word line voltage generating circuits and exemplary operations thereof.
Figure 2:
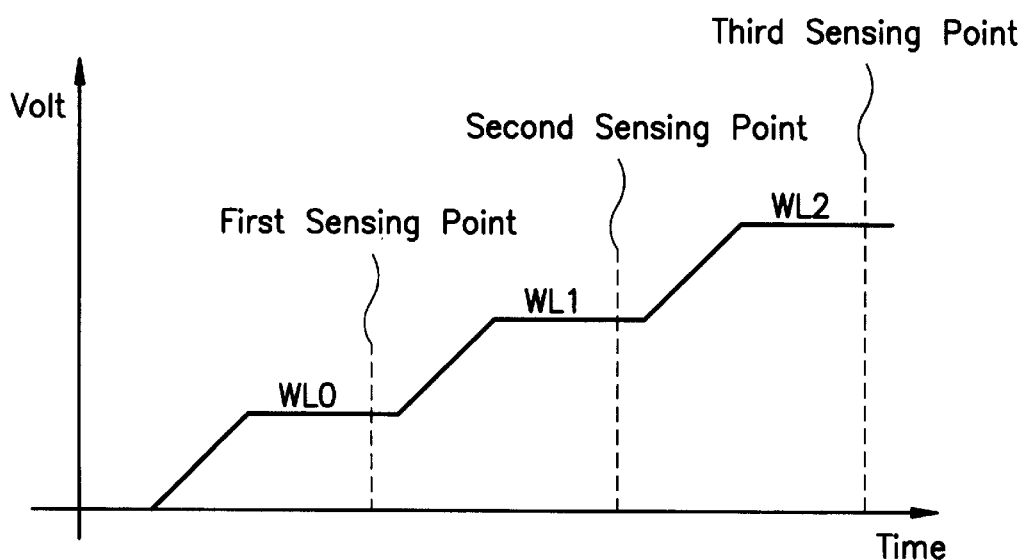

For this reason, the node 8B voltage is higher than the threshold voltage of the NMOS transistor 84, so that the node 3 continues to be charged through the PMOS transistor 82. As the output voltage VP is increased, the gate-source voltage of the dummy cell M00 exceeds the threshold voltage Vth1 of the dummy cell M00. Thus, the node 8B voltage becomes lower than the threshold voltage of the NMOS transistor 84, causing the node 8A to reach a voltage VCC/VPP−Vtp (where Vtp is the threshold voltage of the transistor 81) and the PMOS transistor 83 to turn off. Thus, the variable current mirror 110 detects whether a current flows through the dummy cell M00, and then stops supplying the node 3 with a current in accordance with the detection result. At this time, the node 3 voltage VP (corresponding to word line voltage WL0 as shown in FIG. 2), is set at a voltage of "Vth1+V offset", wherein the offset voltage V offset is a voltage across the resistor 87 and provides a sensing margin for the memory cell. The offset voltage Voffset is determined by the value of the resistor 87.

After the signal NO_ACT1 is deasserted (i.e.,. taken low), the signals NO_ACT2 and NO_ACT3 are sequentially activated, as shown in FIG. 11. The second and third word line voltage generators 101 and 102 operate in a manner similar to the first word line voltage generator 100 and generate output voltages VP at levels "Vth2+Voffset" and of "Vth3+Voffset", respectively. After three sensing operations have been completed, the signal STG is then taken high again. This grounds node 3 so that the word line voltage generating circuit 13' is disabled.

In each of the word line voltage generators 100, 101 and 102, dummy cells M00, M01 and M10 set at threshold voltages Vth1, Vth2 and Vth3, respectively, are provided. Accordingly, although threshold voltage of each memory cell may vary because of a process variation, the threshold voltages of the dummy cells M00, M01 and M10 change comparably. Therefore, each generator compensates for the threshold voltage variation, and data reading operations can be performed more reliably.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. In a multi-level memory device including a plurality of memory cells, each of which has a programmable threshold voltage such that the memory cell produces a current in response to a word line voltage applied thereto, an apparatus for generating word line voltages comprising:

a plurality of memory cell referenced regulators connected to an output terminal that is configured to connect to the plurality of memory cells, a respective one of said memory cell referenced regulators including:

a variable current mirror having a controlled current path and an output current path including said output terminal, said controlled current path having a controlled impedance therein that provides a variable impedance responsive to a control voltage applied thereto such that current produced at said output terminal is proportional to current in said controlled current path; and a control circuit connected between said output terminal and said controlled impedance and including a dummy memory cell having a predetermined threshold voltage, said control circuit operative to apply a control voltage to said controlled impedance to vary a current at said output terminal when an output voltage at said output terminal is greater than a sum of said predetermined threshold voltage of said dummy memory cell and a predetermined offset voltage.

2. An apparatus according to claim 1, wherein said controlled impedance comprises a transistor having first and second controlled electrodes in said controlled current path and a control electrode connected to said control circuit.

3. An apparatus according to claim 2, wherein said control circuit comprises:

a dummy memory cell transistor having a control electrode electrically coupled to said output terminal and a controlled electrode connected to said controlled impedance, wherein said dummy memory cell transistor is operative to vary a control voltage applied to said controlled impedance when a voltage at said control electrode is greater than said sum of said predetermined threshold voltage and said predetermined offset voltage.

4. An apparatus according to claim 3, wherein said control circuit comprises a resistor connected in series between said dummy memory cell and a signal ground.

5. An apparatus according to claim 1:

wherein said variable current mirror comprises:

a first transistor having a first controlled electrode connected to said controlled impedance, a second controlled electrode, and a control electrode;

a second transistor having a control electrode connected to said control electrode of said first transistor, a first controlled electrode connected to said output terminal, and a second controlled electrode connected to said second controlled electrode of said first transistor; and wherein each of said memory cell referenced regulators further comprises:

a first switch connected in series with said first and second controlled electrodes of said first transistor and with said controlled impedance and operative to allow and prevent current flow in said controlled current path responsive to a control signal applied thereto; and a second switch connected between said first and said second controlled electrodes of said first transistor and operative to enable and disable operation of said variable current mirror responsive to said control signal.

6. An apparatus according to claim 5, wherein said first and second switches comprise transistors having respective control electrodes configured to receive said control signal.

7. An apparatus according to claim 6, further comprising a third switch connected between said output terminal and a signal ground and operative to allow and prevent current flow from said word line voltage generator to the plurality of memory cells responsive to a second control signal applied thereto.

8. An apparatus according to claim 7, wherein said third switch comprises a transistor having a control electrode configured to receive said second control signal.

9. A memory cell referenced regulator for producing a read voltage for a multi-level memory device including a plurality of multilevel memory cells, the regulator comprising:

a variable current mirror having a controlled current path and an output current path including an output terminal that is configured to connect to the plurality of memory cells, said controlled current path having a controlled impedance therein that provides a variable impedance responsive to a control voltage applied thereto such that current produced at said output terminal is proportional to current in said controlled current path; and a control circuit connected between said output terminal and said controlled impedance and including a dummy memory cell having a predetermined threshold voltage, said control circuit operative to apply a control voltage to said controlled impedance to vary a current at said output terminal when an output voltage at said output terminal is greater than a sum of said predetermined threshold voltage of said dummy memory cell and a predetermined offset voltage.

10. An apparatus according to claim 9, wherein said controlled impedance comprises a transistor having first and second controlled electrodes in said controlled current path and a control electrode connected to said control circuit.

11. An apparatus according to claim 10, wherein said control circuit comprises:

a dummy memory cell transistor having a control electrode electrically coupled to said output terminal and a controlled electrode connected to said controlled impedance, wherein said dummy memory cell transistor is operative to vary a control voltage applied to said controlled impedance when a voltage at said control electrode is greater than said sum of said predetermined threshold voltage and said predetermined offset voltage.

12. An apparatus according to claim 11, wherein said control circuit comprises a resistor connected in series between said dummy memory cell and a signal ground.

* * * * *

UNITED STATES PATENT AND TRADEMARK OFFICE
CERTIFICATE OF CORRECTION

PATENT NO. : 6,075,725
DATED : June 13, 2000
INVENTOR(S) : Choi et al.

It is certified that error appears in the above-indentified patent and that said Letters Patent is hereby corrected as shown below:

Column 1, line 53, please delete "WL0-WL1" and substitute -- WL0-WL2 -- therefor.

Signed and Sealed this

Third Day of April, 2001

Attest:

NICHOLAS P. GODICI

*Attesting Officer*  *Acting Director of the United States Patent and Trademark Office*